United States Patent
Hishiya et al.

(10) Patent No.: US 12,438,055 B2
(45) Date of Patent: Oct. 7, 2025

(54) ABNORMALITY DETECTION METHOD AND PROCESSING APPARATUS

(71) Applicant: Tokyo Electron Limited, Tokyo (JP)

(72) Inventors: Shingo Hishiya, Yamanashi (JP); Nobutoshi Terasawa, Sapporo (JP); Fumiaki Nagai, Sapporo (JP); Kazuaki Sasaki, Sapporo (JP); Hiroaki Kikuchi, Oshu (JP); Masayuki Kitamura, Yamanashi (JP); Kazuo Yabe, Yamanashi (JP); Motoshi Fukudome, Yamanashi (JP); Tatsuya Miyahara, Yamanashi (JP); Eiji Kikama, Yamanashi (JP); Yuki Tanabe, Yamanashi (JP); Tomoyuki Nagata, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 904 days.

(21) Appl. No.: 17/675,225

(22) Filed: Feb. 18, 2022

(65) Prior Publication Data
US 2022/0270940 A1    Aug. 25, 2022

(30) Foreign Application Priority Data
Feb. 25, 2021    (JP) .................................. 2021-029150

(51) Int. Cl.
H01L 21/66    (2006.01)
C23C 16/455   (2006.01)
C23C 16/52    (2006.01)
H01L 21/02    (2006.01)

(52) U.S. Cl.
CPC ........ *H01L 22/20* (2013.01); *C23C 16/45561* (2013.01); *C23C 16/52* (2013.01); *H01L 21/02057* (2013.01); *H01L 21/02271* (2013.01)

(58) Field of Classification Search
CPC .............. C23C 16/45561; C23C 16/52; H01L 21/02057; H01L 21/02271; H01L 21/67253; H01L 22/20
See application file for complete search history.

(56) References Cited

U.S. PATENT DOCUMENTS

| 10,692,744 B2 * | 6/2020 | Miyoshi ............ H01J 37/32091 |
| 10,883,866 B2 * | 1/2021 | Sugita ....................... G01F 1/36 |
| 2008/0067146 A1 * | 3/2008 | Onishi .................... C23C 16/52 |
| | | 73/31.04 |

(Continued)

FOREIGN PATENT DOCUMENTS

| JP | 2014-047358 A | 3/2014 |
| JP | 2018-044887 A | 3/2018 |
| WO | 2006/095772 A1 | 8/2008 |

*Primary Examiner* — Jaehwan Oh
(74) *Attorney, Agent, or Firm* — Venjuris, P.C.

(57) ABSTRACT

An abnormality detection method includes: supplying a gas controlled to a selected rate to a gas supply pipe via the gas pipe connected to the gas supply pipe, thereby introducing the gas into a reaction region of a processing container provided in a processing apparatus from a gas hole of the gas supply pipe; measuring a pressure inside the gas pipe by a pressure gauge attached to the gas pipe; and detecting an abnormality of at least one of the gas supply pipe and the gas pipe based on the pressure measured at the measuring.

9 Claims, 7 Drawing Sheets

(56) References Cited

U.S. PATENT DOCUMENTS

| | | | |
|---|---|---|---|
| 2013/0092269 A1* | 4/2013 | Nakada | G05D 7/0635 |
| | | | 137/613 |
| 2014/0013838 A1* | 1/2014 | Sawada | G01F 1/86 |
| | | | 73/203 |
| 2017/0275757 A1* | 9/2017 | Kikuchi | C23C 16/45561 |
| 2018/0204742 A1* | 7/2018 | Tateno | H01L 21/67248 |
| 2018/0374727 A1* | 12/2018 | Miyoshi | G05D 11/13 |
| 2022/0004208 A1* | 1/2022 | Scoggins | G05D 7/0623 |
| 2022/0390269 A1* | 12/2022 | Hidaka | G01F 15/005 |

* cited by examiner

ABNORMALITY DETECTION METHOD AND PROCESSING APPARATUS

CROSS-REFERENCE TO RELATED APPLICATION

This application is based on and claims priority from Japanese Patent Application No. 2021-029150 filed on Feb. 25, 2021 with the Japan Patent Office, the disclosure of which is incorporated herein in its entirety by reference.

TECHNICAL FIELD

The present disclosure relates to an abnormality detection method and a processing apparatus.

BACKGROUND

Japanese Patent Laid-Open Publication No. 2018-044887 discloses a method for inspecting a gas supply line in a semiconductor manufacturing apparatus, and a method for calibrating a flow rate controller.

SUMMARY

According to an aspect of the present disclosure, an abnormality detection method includes: supplying a gas controlled to a selected flow rate to a gas supply pipe via the gas pipe connected to the gas supply pipe, thereby introducing the gas into a reaction region of a processing container provided in a processing apparatus from a gas hole of the gas supply pipe; measuring a pressure inside the gas pipe by a pressure gauge attached to the gas pipe; and detecting an abnormality of at least one of the gas supply pipe and the gas pipe based on the pressure measured at the measuring.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
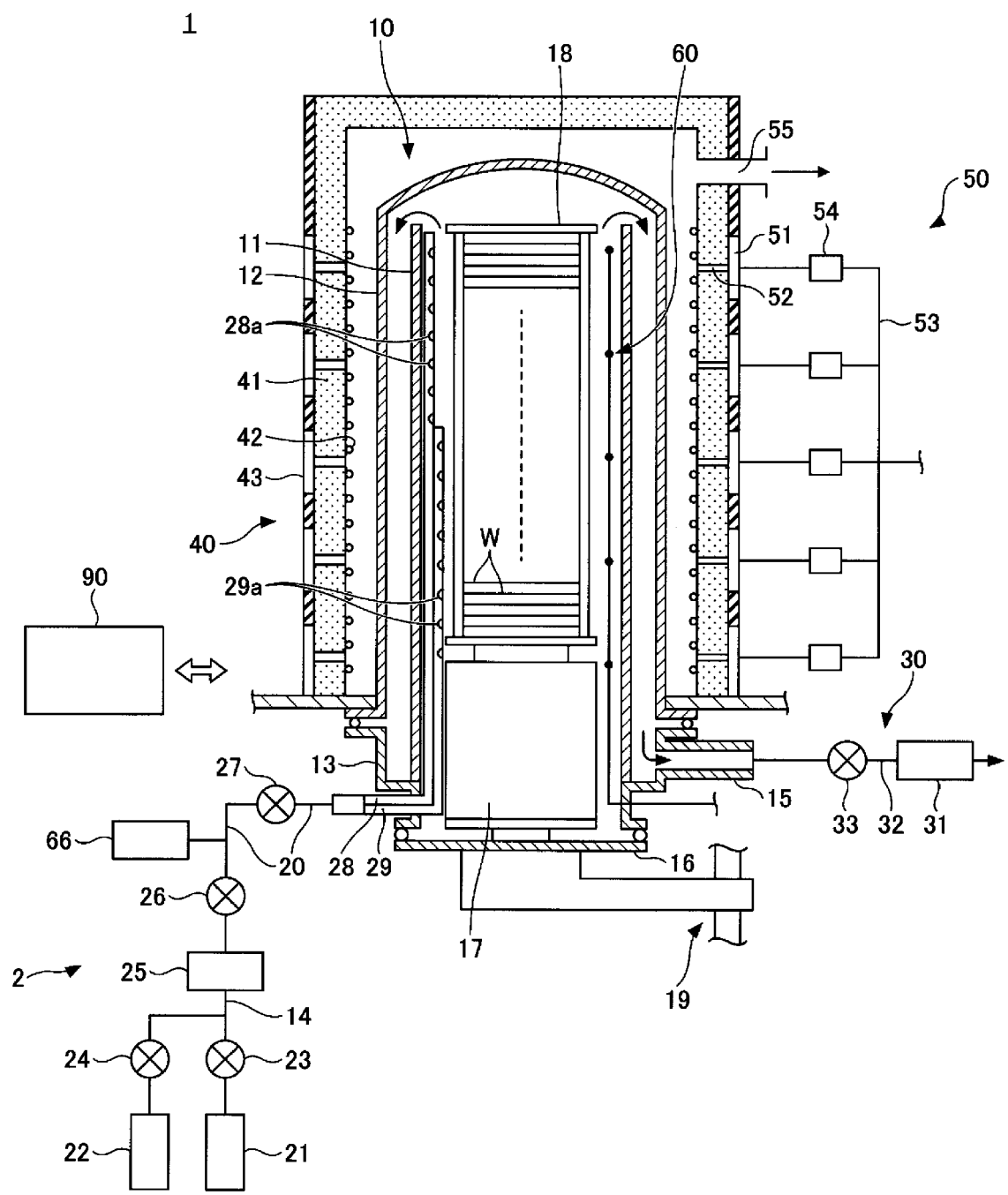
FIG. 1 is a schematic diagram illustrating an example of a processing apparatus according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for carrying out the present disclosure will be described with reference to the accompanying drawings. In each of the drawings, the same elements may be designated by the same reference numerals and redundant descriptions thereof may be omitted.

[Processing Apparatus]

An example of a processing apparatus according to an embodiment of the present disclosure will be described with reference to FIG. 1. FIG. 1 is a schematic diagram illustrating an example of a processing apparatus 1 according to the embodiment. The processing apparatus 1 includes a processing container 10, a gas supply 2, an exhauster 30, a heater 40, a cooler 50, a temperature sensor 60, a pressure gauge 66, and a controller 90.

The processing container 10 has a substantially cylindrical shape. The processing container 10 includes an inner pipe 11, an outer pipe 12, a manifold 13, injectors 28 and 29, a gas outlet 15, and a cover 16. The injectors 28 and 29 are examples of a gas supply pipe.

The inner pipe 11 has a substantially cylindrical shape. The inner pipe 11 is made of a heat-resistant material such as quartz. The inner pipe 11 is also referred to as an inner tube.

The outer pipe 12 has a substantially cylindrical shape with a ceiling and is provided concentrically around the inner pipe 11. That is, the inner pipe 11 and the outer pipe 12 form a double pipe structure. The outer pipe 12 is made of a heat-resistant material such as quartz. The outer pipe 12 is also referred to as an outer tube.

The manifold 13 has a substantially cylindrical shape. The manifold 13 supports the lower ends of the inner pipe 11 and the outer pipe 12. The manifold 13 is made of, for example, stainless steel.

The injectors 28 and 29 penetrate the manifold 13 and extend horizontally into the inner pipe 11, bend in an L shape in the inner pipe 11, and extend upward. The base ends of the injectors 28 and 29 are connected to the gas pipe 20. The injector 28 has a plurality of gas holes 28a that opens toward the center of the inner pipe 11. The injector 29 has a plurality of gas holes 29a that opens toward the center of the inner pipe 11. The plurality of gas holes 28a and 29a are provided at equal intervals in the height direction. The gas supplied from the injectors 28 and 29 includes, for example, a film forming gas, a processing gas such as a cleaning gas, and an inert gas. In the present disclosure, the film forming gas includes, for example, a silicon-containing gas, a nitride gas, an oxidizing gas, and a doping gas when forming a silicon-containing film. The silicon-containing film includes, for example, a silicon film, a silicon nitride film, and a silicon oxide film. The cleaning gas includes a halogen-containing gas such as $F_2$ gas, $Cl_2$ gas, $ClF_3$ gas, $NF_3$ gas, and HF gas. The inert gas is a gas for replacing the atmosphere in the processing container 10 with an inert gas atmosphere and includes, for example, $N_2$ gas and Ar gas.

The gas supply 2 includes a processing gas source 21, an inert gas source 22, a gas supply line 14, a flow rate controller 25, and a gas pipe 20. The processing gas source 21 is a supply source of the processing gas, and includes, for example, a film forming gas source and a cleaning gas source. The inert gas source 22 is a supply source of the inert gas and includes the inert gas source 22. The gas supply line 14 and the gas pipe 20 connect the processing gas source 21 and the inert gas source 22 with the injectors 28 and 29.

An on-off valve 23 is provided on the gas supply line 14 between the processing gas source 21 and the flow rate controller 25. An on-off valve 24 is provided on the gas supply line 14 between the inert gas source 22 and the flow rate controller 25. The on-off valve 23 controls the supply of the processing gas and stop of the supply by opening and closing a valve body. The on-off valve 24 controls the supply of the inert gas and stop of the supply by opening and closing the valve body. The flow rate controller 25 is connected to the gas supply line 14 and the gas pipe 20, controls the gas supplied from various gas sources to a predetermined flow rate, and causes the gas to flow to the gas pipe 20. The flow rate controller 25 is, for example, a mass flow controller.

The gas pipe 20 is provided with an on-off valve 27 on the injectors 28 and 29 side, and an on-off valve 26 on the flow rate controller 25 side. By opening and closing the valve bodies of the on-off valves 26 and 27, the supply/stop of supply of various gases and switching of gas are controlled.

A pressure gauge 66 is attached to the gas pipe 20. In FIG. 1, the pressure gauge 66 is attached between the on-off valves 26 and 27 disposed on the gas pipe 20. However, without being limited to this, the pressure gauge 66 may be attached to any position of the gas pipe 20 between the injectors 28 and 29 and the flow rate controller 25. The pressure gauge 66 measures the pressure in the gas pipe 20. The pressure gauge 66 transmits the detected pressure to the controller 90.

The processing gas is output from the processing gas source 21 and is controlled to a predetermined flow rate by the flow rate controller 25. The processing gas is supplied to the injectors 28 and 29 via the gas pipe 20, and is horizontally discharged from the gas holes 28a and 29a of the injectors 28 and 29 into the inner pipe 11 which is a reaction region in the processing container 10.

The inert gas is output from the inert gas source 22 and controlled to a predetermined flow rate by the flow rate controller 25. The inert gas is supplied to the injectors 28 and 29 via the gas pipe 20, and is horizontally discharged from the gas holes 28a and 29a of the injectors 28 and 29 into the inner pipe 11 which is a reaction region in the processing container 10. The injector 28 is provided approximately up to the height of the upper end of the inner pipe 11 in the height direction of the processing container 10, and discharges gas from the gas holes 28a evenly disposed in the height direction. The injector 29 has a height of about half that of the injector 28, and discharges gas from the gas holes 29a evenly disposed in the height direction.

However, the length (height) of the injector is not limited thereto. Among the plurality of injectors, the injector 28 has the longest shape and is also referred to as "TOP INJ." The injector 29 has a shape of medium length shorter than that of the injector 28, and is also referred to as "CTR INJ."

Further, in the example of FIG. 1, the number of injectors 28 and 29 is two, but the number of injectors may be one or three or more. For example, an injector having a shape of the shortest length, which is shorter than the injector 29, may be provided together with the injectors 28 and 29.

The gas outlet 15 is formed in the manifold 13. An exhaust pipe 32 is connected to the gas outlet 15. The processing gas supplied into the processing container 10 is exhausted by the exhauster 30 via the gas outlet 15.

The exhauster 30 includes an exhaust device 31, an exhaust pipe 32, and a pressure controller 33. The exhaust device 31 is a vacuum pump such as a dry pump or a turbo molecular pump. The exhaust pipe 32 connects the gas outlet 15 and the exhaust device 31. The pressure controller 33 is interposed in the exhaust pipe 32, and controls the pressure in the processing container 10 by adjusting the conductance of the exhaust pipe 32. The pressure controller 33 is, for example, an automatic pressure control valve.

The cover 16 airtightly closes an opening at the lower end of the manifold 13. The cover 16 is made of, for example, stainless steel. A wafer boat 18 is disposed on the cover 16 via a heat insulating cylinder 17. The heat insulating cylinder 17 and the wafer boat 18 are made of a heat-resistant material such as quartz. The wafer boat 18 holds a plurality of wafers W substantially horizontally at predetermined intervals in the vertical direction. When a lifting mechanism 19 raises the cover 16, the wafer boat 18 is loaded into the processing container 10 and accommodated therein. When the lifting mechanism 19 lowers the cover 16, the wafer boat 18 is unloaded from the processing container 10.

The heater 40 includes a heat insulating material 41, a heating element 42, and an outer skin 43. The heat insulating material 41 has a substantially cylindrical shape and is provided around the outer pipe 12. The heat insulating material 41 is formed mainly of silica and alumina. The heating element 42 has a linear shape and is provided in a spiral or meandering shape on the inner circumference of the heat insulating material 41. The outer skin 43 is provided to cover the outer periphery of the heat insulating material 41. The outer skin 43 keeps the shape of the heat insulating material 41 and reinforces the heat insulating material 41. The outer skin 43 is made of a metal such as stainless steel. In order to suppress the influence of heat on the outside of the heater 40, a water-cooled jacket (not illustrated) may be provided on the outer periphery of the outer skin 43. The heater 40 heats the inside of the processing container 10 by generating heat from the heating element 42.

The cooler 50 supplies a cooling fluid toward the processing container 10 to cool the wafer W in the processing container 10. The cooling fluid may be, for example, air. The cooler 50 supplies a cooling fluid toward the processing container 10, for example, when the wafer W is rapidly lowered in temperature after heat treatment. Further, the cooler 50 supplies the cooling fluid toward the inside of the processing container 10, for example, at the time of cleaning to remove the deposited film in the processing container 10. The cooler 50 includes a fluid flow path 51, a blowout hole 52, a distribution flow path 53, a flow rate adjustor 54, and a heat exhaust port 55.

A plurality of fluid flow paths 51 is formed in the height direction between the heat insulating material 41 and the outer skin 43. The fluid flow path 51 is, for example, a flow path formed along the circumferential direction on the outside of the heat insulating material 41.

The blowout hole 52 is formed to penetrate the heat insulating material 41 from each fluid flow path 51, and discharges the cooling fluid into the space between the outer pipe 12 and the heat insulating material 41.

The distribution flow path 53 is provided outside the outer skin 43, and distributes and supplies the cooling fluid to each fluid flow path 51.

The flow rate adjustor 54 is interposed in the distribution flow path 53, and adjusts a flow rate of the cooling fluid supplied to the fluid flow path 51.

The heat exhaust port 55 is provided above the plurality of blowout holes 52, and discharges the cooling fluid supplied to the space between the outer pipe 12 and the heat insulating material 41 to the outside of the processing apparatus 1. The cooling fluid discharged to the outside of the processing apparatus 1 is cooled by, for example, a heat exchanger and supplied to the distribution flow path 53 again. However, the cooling fluid discharged to the outside of the processing apparatus 1 may be discharged without being reused.

The temperature sensor 60 detects the temperature inside the processing container 10. A plurality of temperature sensors 60 is provided, for example, in the inner pipe 11 at equal intervals in the height direction, and detects temperatures at a plurality of heights in the inner pipe 11.

The controller 90 controls the operation of the processing apparatus 1. The controller 90 may be, for example, a computer. The computer program that executes the entire operation of the processing apparatus 1 is stored in a storage medium. The storage medium may be, for example, a flexible disk, a compact disk, a hard disk, a flash memory, or a DVD. The controller 90 acquires the pressure measured by the pressure gauge 66, and detects abnormality of at least one of the injectors 28 and 29 and the gas pipe 20 based on the pressure.

[Abnormality Detection Method]

Figure 2:
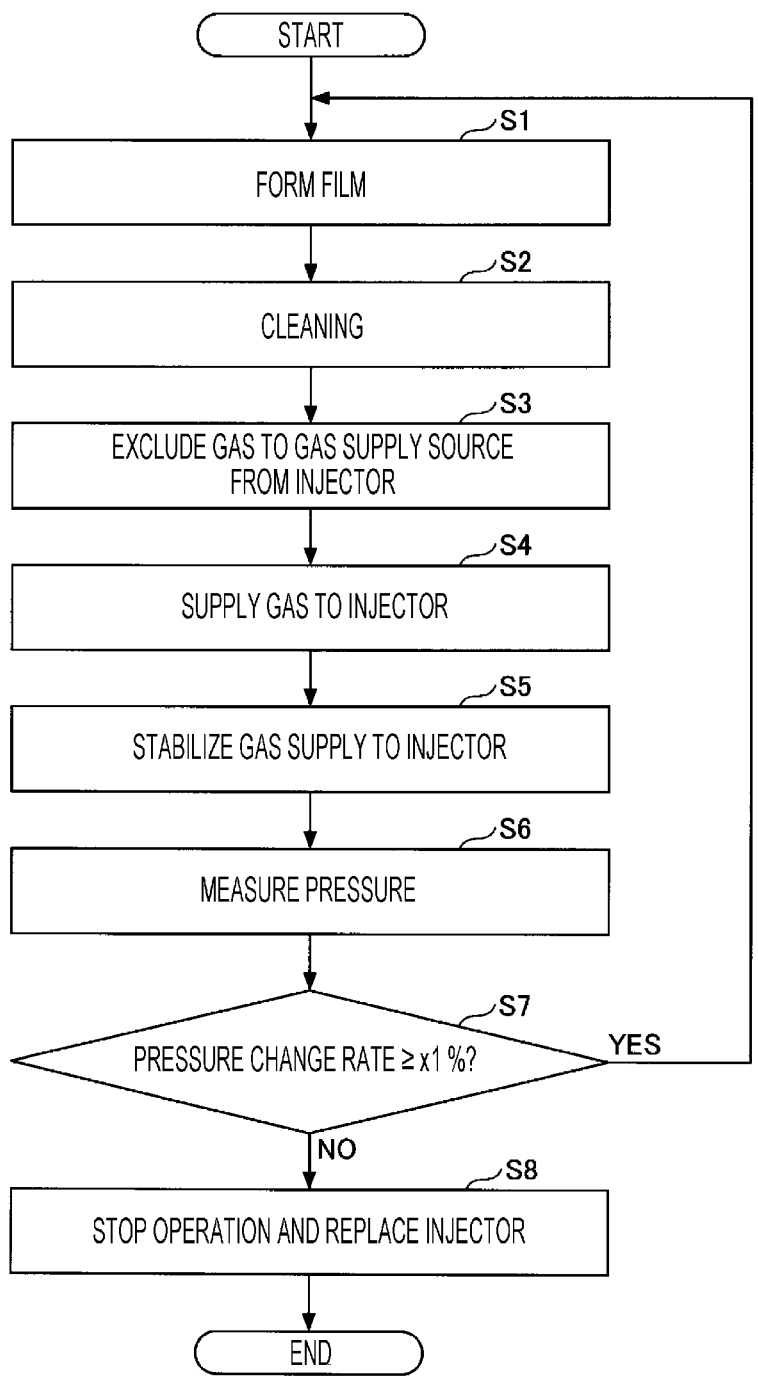
FIG. 2 is a flow chart illustrating an example of an abnormality detection method according to the embodiment.

Next, an example of the abnormality detection method according to the embodiment of the present disclosure will be described with reference to a flow chart illustrating an example of the abnormality detection method according to the embodiment of FIG. 2. In FIG. 2, as an example of the process executed by the processing apparatus 1, the film forming process and the cleaning process are sequentially executed, and the abnormality detection process (abnormality detection method) of the present disclosure is executed after the cleaning process. This process is controlled by the controller 90. Before the main process is started, when the lifting mechanism 19 raises the cover 16, the wafer boat 18 is loaded into the processing container 10 and accommodated in the processing container 10.

When the process is started, in step S1, the controller 90 executes the film forming process. At this time, the on-off valves 23, 26, and 27 are opened, and the on-off valve 24 is closed. The film forming gas supplied from the film forming gas source of the processing gas source 21 is supplied to the injectors 28 and 29 via the gas pipe 20, and introduced into the inner pipe 11 from the gas holes 28a and 29a. As a result, the film forming process is executed on the plurality of substrates W. During the film forming process, the film forming gas is controlled to a desired flow rate by the flow rate controller 25.

After the film forming process, when the lifting mechanism 19 lowers the cover 16, the wafer boat 18 is unloaded out of the processing container 10. Thereafter, in step S2, the controller 90 executes a cleaning process. At this time, the cleaning gas supplied from the cleaning gas source of the processing gas source 21 is supplied to the injectors 28 and 29 via the gas pipe 20 and introduced into the inner pipe 11 from the gas holes 28a and 29a. As a result, a cleaning process is executed on the inside of the processing container 10. During the cleaning process, the cleaning gas is controlled to a desired flow rate by the flow rate controller 25. The cleaning process may be executed after the wafer boat 18 is loaded into the processing container 10 and accommodated in the processing container 10.

After the cleaning process, in steps S3 to S7, the controller 90 executes the abnormality detection process. In the abnormality detection process, the pressure is measured by a pressure gauge 66. An MFC equipped with a pressure gauge (e.g., a flow rate controller 25) may be used to execute a pressure measurement using a pressure detection unit (pressure gauge) in the MFC. That is, the pressure gauge attached to the gas pipe 20 includes the pressure gauge 66 and a pressure gauge mounted on the MFC. There are no restrictions on the gas type, gas flow rate, and gas supply time supplied during the abnormality detection process. However, in order to grasp an amount of change in pressure measured by the pressure gauge 66, it is important to monitor the pressure by controlling the gas type and gas flow rate under the same conditions before and after the abnormality detection process repeated a plurality of times. Therefore, in order to carry out an accurate pressure measurement, the processes of steps S3 to S5 are executed before the pressure measurement in step S6, and the gas type and gas flow rate are controlled under the same conditions. In the present disclosure, the controller 90 supplies $N_2$ gas to execute the abnormality detection process, but the gas supplied in the abnormality detection process is not limited thereto and may be Ar gas or He gas.

As a process for executing a pressure monitoring under the same conditions, in step S3, the controller 90 removes the remaining gas in the gas flow path of the gas supply 2 in order to create a stable initial state. Specifically, the gas in the gas flow path connected to the gas source (the processing gas source 21 and the inert gas source 22), which is a gas supply source, is removed from the injectors 28 and 29 via the gas pipe 20 and the gas supply line 14. The gas in the gas flow path connected to the gas source is removed from the injectors 28 and 29 by opening the on-off valves 26 and 27, and exhausting the inside of the processing container 10 and the gas flow path of the gas supply 2 by the exhaust device 31.

Next, in step S4, the controller 90 opens the on-off valve 24, controls $N_2$ gas to a predetermined flow rate by the flow rate controller 25 while keeping the on-off valves 26 and 27 open, and supplies the $N_2$ gas to the injectors 28 and 29. Next, in step S5, the controller 90 continues to cause the $N_2$ gas to flow at a predetermined flow rate for a preset time. As a result, before the pressure is measured by the pressure gauge 66, a constant flow rate of $N_2$ gas is supplied to the injectors 28 and 29 to stabilize the gas supply. While the abnormality detection process of the present disclosure is being executed, a state inside the processing container 10 may have a low degree of vacuum, that is, a high vacuum. Further, the gas flow rate of $N_2$ gas may be a large flow rate so that changes in conductance of the injectors 28 and 29 and the gas holes 28a and 29a are easily detected.

Next, in step S6, the pressure gauge 66 measures the pressure and transmits the measured pressure to the controller 90, and the controller 90 acquires the measured pressure from the pressure gauge 66. Next, in step S7, the controller 90 controls the gas type and gas flow rate under the same conditions when the injectors 28 and 29 are new, and calculates the change rate of the pressure (denoted as "P2") measured this time with respect to the pressure (denoted as "P1") measured by the pressure gauge 66 (hereinafter, referred to as a "pressure change rate"). The pressure P1 measured when the injectors 28 and 29 are new is stored in a storage unit of the controller 90. The controller 90 calculates the pressure change rate (%) from the formula (P2/P1)×100 based on the pressure P2 measured this time.

The controller 90 determines whether the calculated pressure change rate is equal to or greater than a preset threshold value x1%. When it is determined that the calculated pressure change rate is equal to or greater than the threshold value x1, the controller 90 determines that the pressure change is not large as compared with when the injector is new, that is, no abnormality is detected. In this case, the controller 90 returns to step S1 and repeatedly executes the processes of steps S1 to S7 (the film forming process of the next lot, etc.).

Meanwhile, in step S7, when it is determined that the calculated pressure change rate is less than the threshold value x1%, the controller 90 determines that the pressure change is large as compared with when the injector is new, that is, an abnormality is detected. In this case, in step S8, the controller 90 stops the operation of the processing apparatus 1, replaces the injector, and ends this process.

Figure 3:
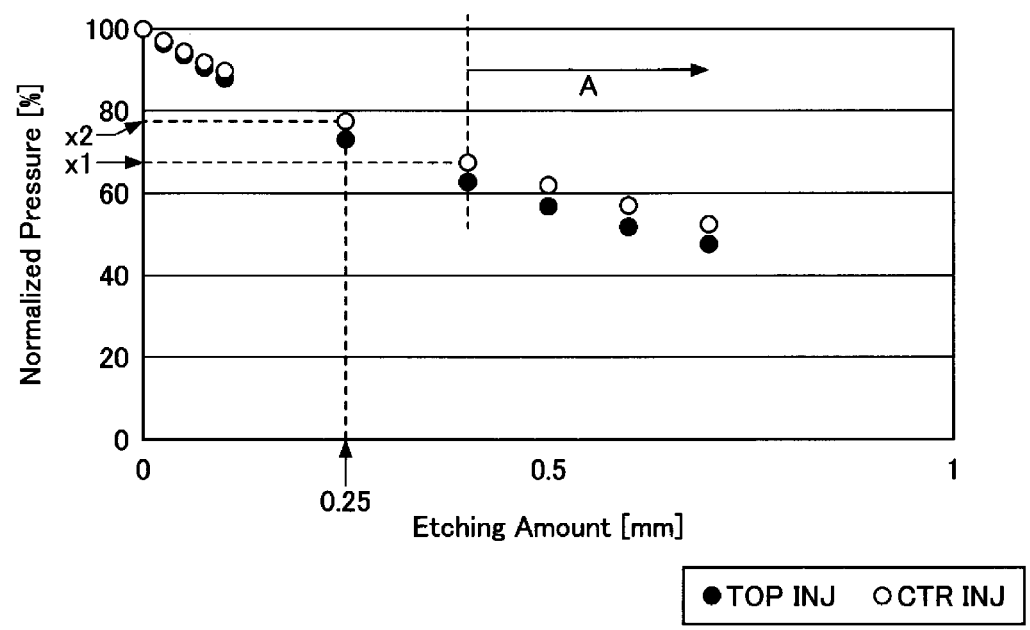
FIG. 3 is a graph illustrating the abnormality detection method of FIG. 2.

The graph of FIG. 3 illustrates a simulation result indicating a relationship between an etching amount of the injector and a normalized pressure. The etching amount of the injector is the amount of scraping of the injector. When the injector is scraped by a cleaning gas, the conductance changes and the pressure measured by the pressure gauge 66 changes.

In this simulation, the flow rate of $N_2$ gas is controlled to 500 sccm. The horizontal axis of the graph indicates an etching amount (mm) of the injectors 28 and 29, and the vertical axis thereof indicates a normalized pressure change rate (%). When the horizontal axis is 0 mm, that is, when the etching amount is 0, the injectors 28 and 29 are new. Therefore, assuming that the pressure change rate when the injectors 28 and 29 are new is 100%, the vertical axis indicates the pressure change rate measured by the pressure gauge 66 with respect to the etching amount of the injectors 28 and 29. The black circles in the graph indicate the pressure change rate with respect to the etching amount when the injector 28 (denoted as "TOP INJ") is used, and the white circles indicate the pressure change rate with respect to the etching amount when the injector 29 (denoted as "CTR INJ") is used.

The simulation result of FIG. 3 illustrates that the conductance of the injectors 28 and 29 increases as the etching of the injectors 28 and 29 progresses, thereby decreasing the pressure measured by the pressure gauge 66. Here, the etching amount of the injectors 28 and 29 has been described. However, similarly, as for the etching of the gas pipe 20, as the etching of the gas pipe 20 progresses, the conductance of the gas pipe 20 increases, and the pressure measured by the pressure gauge 66 decreases. Therefore, by monitoring the change in pressure measured by the pressure gauge 66, it is possible to detect abnormality of at least one of the injectors 28 and 29 and the gas pipe 20 connected to the injectors 28 and 29.

When the etching amount of the injectors 28 and 29 increases, the conductance of the gas flowing through the injectors 28 and 29 increases, and the pressure measured by the pressure gauge 66 decreases. For example, as indicated by the arrow "A" in FIG. 3, when the pressure change rate is less than 65%, it may be determined that there is a risk of damage such as a large etching amount of the injectors 28 and 29 and the injectors 28 and 29 being broken. Therefore, the threshold value x1% is set in advance as 65% and stored in the storage unit. Then, when it is determined in the abnormality detection process that the pressure change rate is less than the threshold value x1%, the operation of the processing apparatus 1 is stopped or the injector is replaced before the injector is damaged. However, the set value of the threshold value x1% is not limited thereto.

By operating the processing apparatus 1 for a long period of time, the injectors 28 and 29 and/or the gas pipe 20 are etched or formed with a cleaning gas, an etching gas, or a film forming gas. Further, these gases cause the gas holes 28a and 29a to expand or become clogged. This may cause product defects and worsen the mass production operating rate.

Therefore, in the processing apparatus 1 according to the present disclosure, any gas such as $N_2$ gas is supplied to the gas pipe 20, the injectors 28 and 29, and the gas holes 28a and 29a, and the pressure in the gas pipe 20 is measured by the pressure gauge 66 when the gas supply is stabilized. The measured pressure is transmitted to the controller 90, and the controller 90 acquires the measured pressure and calculates the rate of change (pressure change rate) from the pressure when the injectors 28 and 29 are new.

The change in conductance in the injectors 28 and 29 and the gas pipe 20 may be grasped from the pressure change rate. Therefore, the controller 90 may detect from the calculated pressure change rate that an abnormality occurs in at least one of the injectors 28 and 29 and the gas pipe 20. The detection of the abnormality includes the abnormalities of the gas holes 28a and 29a of the injectors 28 and 29.

In the example of FIG. 3, the conductance in the injectors 28 and 29 is increased by etching the injectors 28 and 29 by the cleaning process, and the measured pressure is lower than the initial pressure, but the present disclosure is not limited thereto. For example, when the injectors 28 and 29 form a film by the film forming process, the conductance in the injectors 28 and 29 may decrease, and the measured pressure may be higher than the initial pressure.

That is, the types of abnormalities that may be detected by the abnormality detection method of the present disclosure include a decrease in the thickness of the injectors 28 and 29 due to excessive cleaning, and an increase in the thickness of the injectors 28 and 29 due to excessive film formation.

The types of abnormalities include a damage to the injectors 28 and 29 due to excessive cleaning, an enlargement of the gas holes 28a and 29a due to excessive cleaning, and a clogging (reduction) of the gas holes 28a and 29a due to film formation. Further, the types of abnormalities include an improper installation (presence or absence of leak) of the injectors 28 and 29 at the time of installation or replacement of the injectors 28 and 29, and defects in the connection between the injectors 28 and 29 and the gas pipe 20. The improper installation of the injectors 28 and 29 refers to a case where a connection between an injector and a connection portion of the gas pipe 20 is insufficient and a gas leak occurs. The connection defect refers to an error in a connection destination when the injector 28 is connected to one of the plurality of connection portions of the gas pipe 20 and the injector 29 is connected to the other. The types of abnormalities may include changes in the conductance of the injector, a damage to the gas pipe 20, and a damage to the connection.

[First Modification]

Next, an abnormality detection method according to a first modification will be described with reference to a flow chart illustrating the abnormality detection method according to the first modification of FIG. 4. This process is controlled by the controller 90. When the step number of the flow chart of FIG. 4 overlaps with the step number of the flow chart of FIG. 2, it indicates that the same process is executed.

Figure 4:
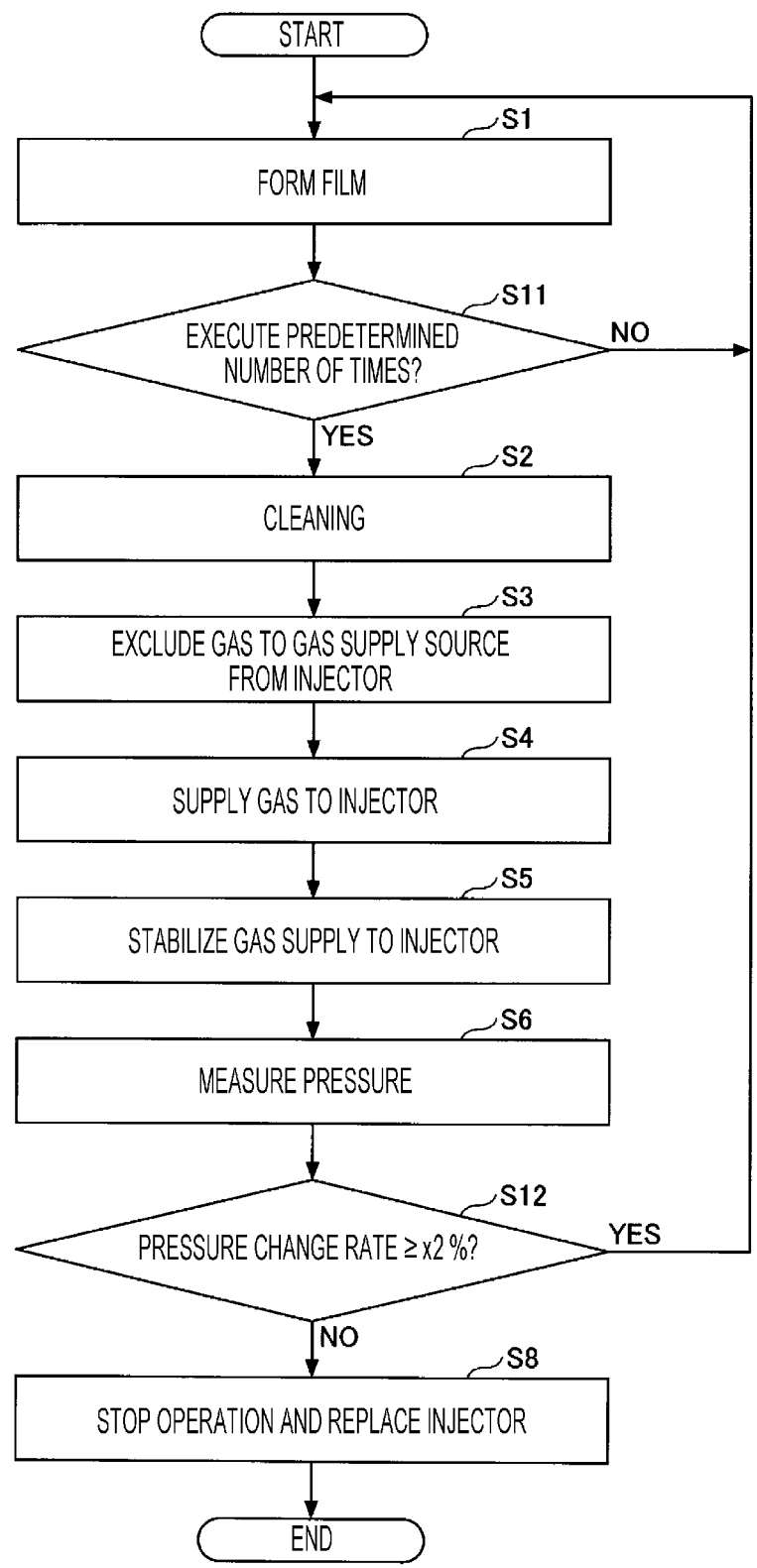
FIG. 4 is a flow chart illustrating a first modification of the abnormality detection method according to the embodiment.

The processes of steps S1 to S8 of the abnormality detection method according to the first modification of FIG. 4 are the same as those of the abnormality detection method according to the embodiment of FIG. 2, and only the processes of steps S11 and S12 are different from the abnormality detection method according to the embodiment of FIG. 2. Specifically, in the abnormality detection method illustrated in FIG. 2, a single film forming process (step S1) is followed by a single cleaning process (step S2), and then the abnormality detection process after step S3 is executed.

In the abnormality detection method according to the first modification of FIG. 4, in step S11, it is determined whether the film forming process of step S1 has been executed a predetermined number of times, and the processes of steps S1 and S11 are repeated until the film forming process is executed a predetermined number of times. After a predetermined number of times of film formation (hereinafter, also referred to as a "cumulative film formation"), the cleaning process of step S2 is executed, and then the abnormality detection process of step S3 and subsequent steps are executed.

In the case of cumulative film formation as described above, a cleaning is executed after the film formation is cumulatively repeated for a certain period of time, and then the abnormality detection process of steps S3 to S6 and S12 is executed. Then, when the pressure change rate is calculated and it is determined in step S12 that the pressure change rate is equal to or greater than the preset threshold value x2%, the pressure change is not large as compared with when the injector is new, that is, no abnormality is detected, and the process returns to step S1 to execute the cumulative film formation of the next lot. Meanwhile, when it is determined that the pressure change rate is less than x2%, it is determined that the pressure change is large as compared with when the injector is new, that is, an abnormality is detected, and the operation of the processing apparatus 1 is stopped, or the injectors 28 and 29 are replaced before the injectors 28 and 29 are damaged, and this process is ended.

Also, in the case of cumulative film formation, the threshold value x2 for determining an abnormality is set in advance. The abnormality detection method and the setting of the threshold value x2 according to the first modification will be described with reference to the graphs of FIGS. 5A to 5D. The graphs of FIGS. 5A to 5D illustrate a simulation result indicating a relationship between the etching amount of the injector and the gas supply ratio from each gas hole. The horizontal axis of the graph indicates the etching amount of the injectors 28 and 29, and the vertical axis thereof indicates the flow rate ratio of the $N_2$ gas supplied from each of the gas holes 28a and 29a of the injectors 28 and 29.

Figure 5A:
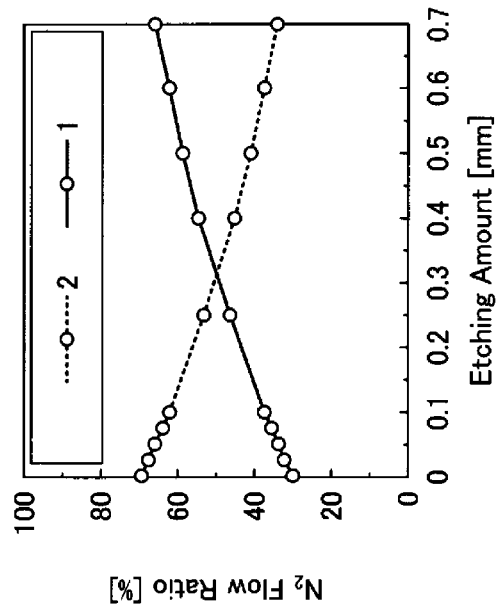
FIGS. 5A to 5D are graphs illustrating the abnormality detection method according to the first modification of FIG. 4.
Figure 5B:
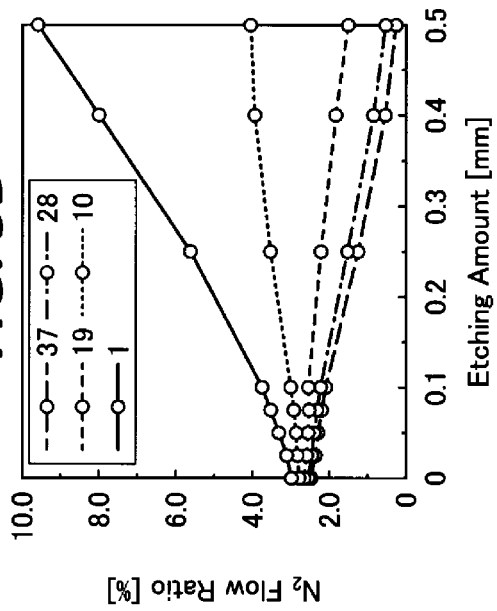

In FIG. 5A, numbers 1 to 5 are assigned in order from the bottom among five gas holes 28a included in the injector 28 ("TOP INJ"), and the flow rate ratio of the $N_2$ gas supplied from the gas holes 28a of 1 to 5 is illustrated. The total flow rate ratio of the $N_2$ gas supplied from each gas hole 28a is 100%. It may be seen that when the injector 28 is new, that is, when the etching amount is 0, the flow rate ratio of the $N_2$ gas supplied from the gas holes 28a of 1 to 5 changes as the etching amount increases, by setting the flow rate ratio of the $N_2$ gas in the gas holes 28a of 1 to 5 as the initial value. For example, when the etching amount of the injector 28 becomes 0.25 mm, it may be determined that the balance of the flow rate ratio of the $N_2$ gas supplied from the gas holes 28a of 1 to 5 is completely out of order from the initial value ratio, and a desired film forming performance is not obtained. Therefore, the etching amount "0.25" is extracted from the graph of FIG. 5A and applied to the injector 28 ("TOP INJ") indicated by the black circle in FIG. 3, and about 75%, which is the pressure change rate when the etching amount is 0.25 mm, is set in advance as the threshold value x2 and stored in the storage unit. However, a method of setting the threshold value x2 is not limited thereto.

Then, the pressure change rate is calculated from the pressure measured by the pressure gauge 66 in step S6 of FIG. 4, and when the pressure change rate is determined to be less than the threshold value x2% in step S12, it is determined that an abnormality has been detected. Also, the operation of step S8 is stopped and the injector 28 is replaced, and this process is ended.

The flow rate ratio of the $N_2$ gas supplied from each gas hole 28a with respect to the injector 28 and the abnormality detection have been described with reference to the graph of FIG. 5A, but the same applies to the injector 29 and other injectors. For example, in FIG. 5B, numbers 1 and 2 are assigned in order from the bottom among the two gas holes 29a of the injector 29 ("CTR INJ"), and the flow rate ratio of the $N_2$ gas supplied from the gas holes 29a of 1 and 2 is illustrated. The total flow rate ratio of the $N_2$ gas supplied from each gas hole 29a is 100%. In this case, it may be seen that when the etching amount is 0, the flow rate ratio of the $N_2$ gas supplied from the gas holes 29a of 1 and 2 changes as the etching amount increases, by setting the flow rate ratio of the $N_2$ gas in each gas hole 29a as the initial value. When the etching amount of the injector 29 becomes about 0.3 mm, it may be determined that the balance of the $N_2$ gas to be supplied from the two gas holes 29a is completely out of order from the initial value, and the desired film forming performance is not obtained. Therefore, the etching amount "0.3" may be extracted from the graph of FIG. 5B and applied to the injector 29 ("CTR INJ") indicated by the white circle in FIG. 3, and the pressure change rate when the etching amount is 0.3 mm may be set in advance as a threshold value and stored in the storage unit.

Figure 5C:
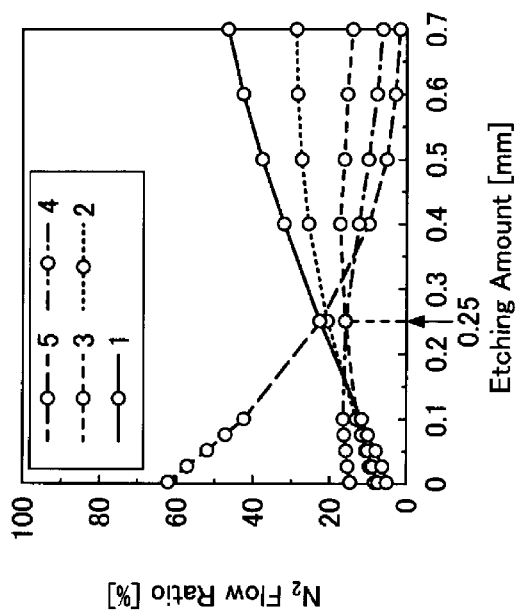
Figure 5D:
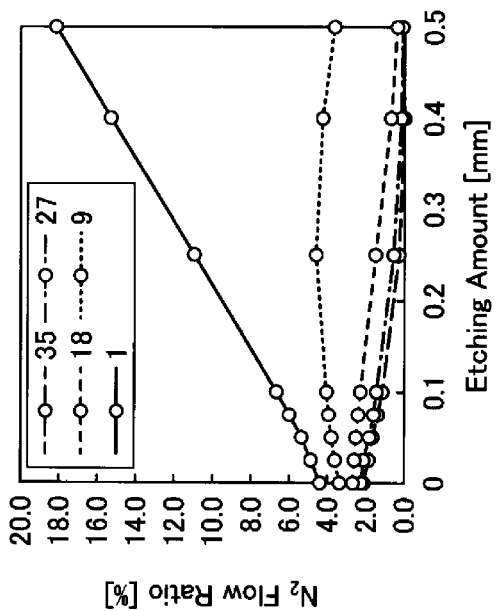

FIG. 5C illustrates an injector ("ALL INJ") having more gas holes than the injector 28, and the number of gas holes is 35, which is larger than that of the injector 28 illustrated in FIG. 5A. Numbers 1 to 35 are assigned in order from the bottom, and the flow rate ratio of $N_2$ gas supplied from the 35 gas holes is illustrated. The total flow rate ratio of the $N_2$ gas supplied from the 35 gas holes is 100%. FIG. 5D illustrates an injector ("BTM INJ") which is shorter than the injector 29 and has 37 gas holes. Numbers 1 to 37 are assigned in order from the bottom, and the flow rate ratio of $N_2$ gas supplied from the 37 gas holes is illustrated. The total flow rate ratio of the $N_2$ gas supplied from the 37 gas holes is 100%.

When the imbalance of the flow rate ratio of the $N_2$ gas supplied from each gas hole exceeds a permissible range in the injector of any length, the desired film forming performance may not be obtained. Therefore, the threshold value for determining the abnormality detection used in step S12 of FIG. 4 is set in advance using the graphs of FIGS. 5A to 5D and 3, and stored in the storage unit. This makes it possible to accurately detect an abnormality for each injector. That is, in step S12 of FIG. 4, when a plurality of injectors is installed, a determination is made on each of the plurality of injectors. At this time, a plurality of pressure gauges 66 may be attached to the branch portions of the gas pipe 20 connected to each of the plurality of injectors, and an abnormality may be detected from a magnitude relationship between the pressure change rate measured by the pressure gauge 66 disposed in the vicinity of each injector and the threshold value for each injector. Similarly, when a plurality of injectors is installed in step S7 of FIG. 2, step S24 of FIG. 6 (to be described later), and step S34 of FIG. 7 (to be described later), a determination process is executed for each of the plurality of injectors, and an abnormality of each injector is detected.

[Second Modification]

Figure 6:
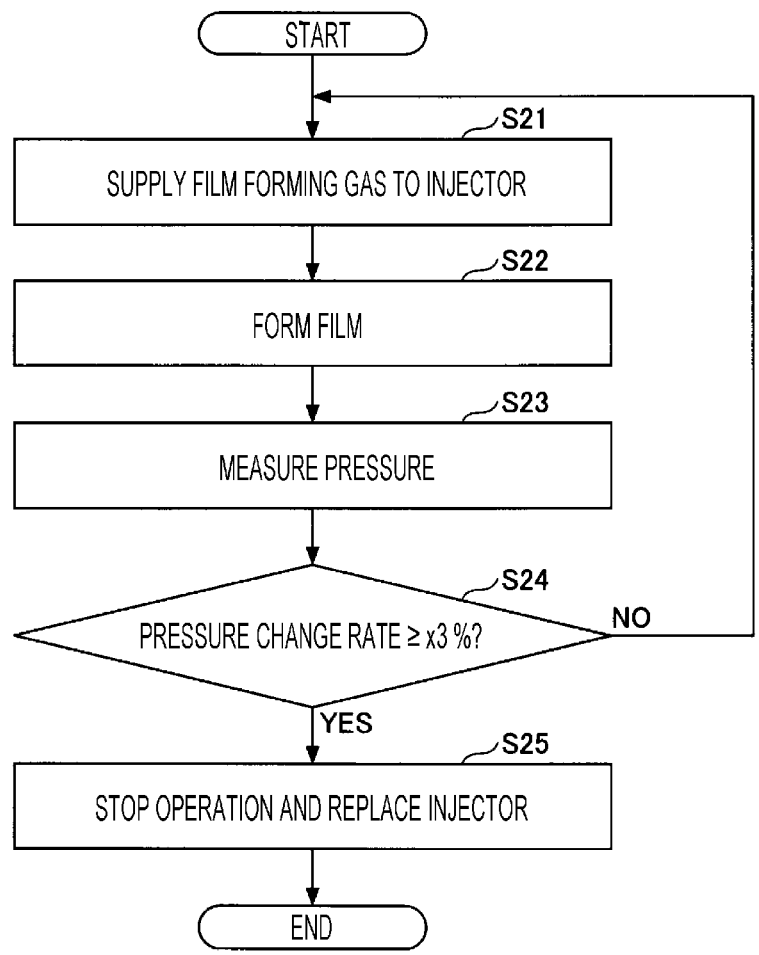
FIG. 6 is a flow chart illustrating a second modification of the abnormality detection method according to the embodiment.

Next, an abnormality detection method according to a second modification will be described with reference to a flow chart illustrating the abnormality detection method according to the second modification of FIG. 6. This describes an example in which, when the injectors 28 and 29 form a film by the film forming process, the conductance in the injectors 28 and 29 is lowered, and the measured pressure is higher than the initial pressure. That is, it is assumed that the gas holes 28*a* and 29*a* are clogged (reduced) due to the film formation. This process is controlled by the controller 90.

In this process, an abnormality detection method is executed during the film forming process. That is, in step S21, the processing gas (film forming gas) is output from the processing gas source 21, supplied to the injectors 28 and 29 via the gas pipe 20, and horizontally discharged into the inner pipe 11 from the gas holes 28*a* and 29*a* of the injectors 28 and 29. Next, in step S22, a film forming process is executed on the substrate.

While the film forming process is being executed, the processing gas is controlled to a predetermined flow rate by the flow rate controller 25 and stably supplied. Next, in step S23, the pressure gauge 66 measures the pressure while the film forming process is being executed. Next, in step S24, the controller 90 calculates the pressure change rate using the measured pressure. A preset threshold value x3 used for determining an abnormality during the film forming process is stored in the storage unit. The controller 90 compares the pressure change rate with the threshold value x3, and when it is determined that the pressure change rate is less than the threshold value x3, the controller 90 returns to step S21 and continues the film forming process.

Meanwhile, when it is determined that the pressure change rate is equal to or greater than the threshold value x3, the controller 90 proceeds to step S25, stops the operation of the processing apparatus 1, replaces the injector, and ends this process.

In the abnormality detection method according to the second modification, the abnormality detection process is executed during the film forming process. Meanwhile, the abnormality detection process may be executed during the cleaning process as in the abnormality detection method according to a third modification described below.

[Third Modification]

Figure 7:
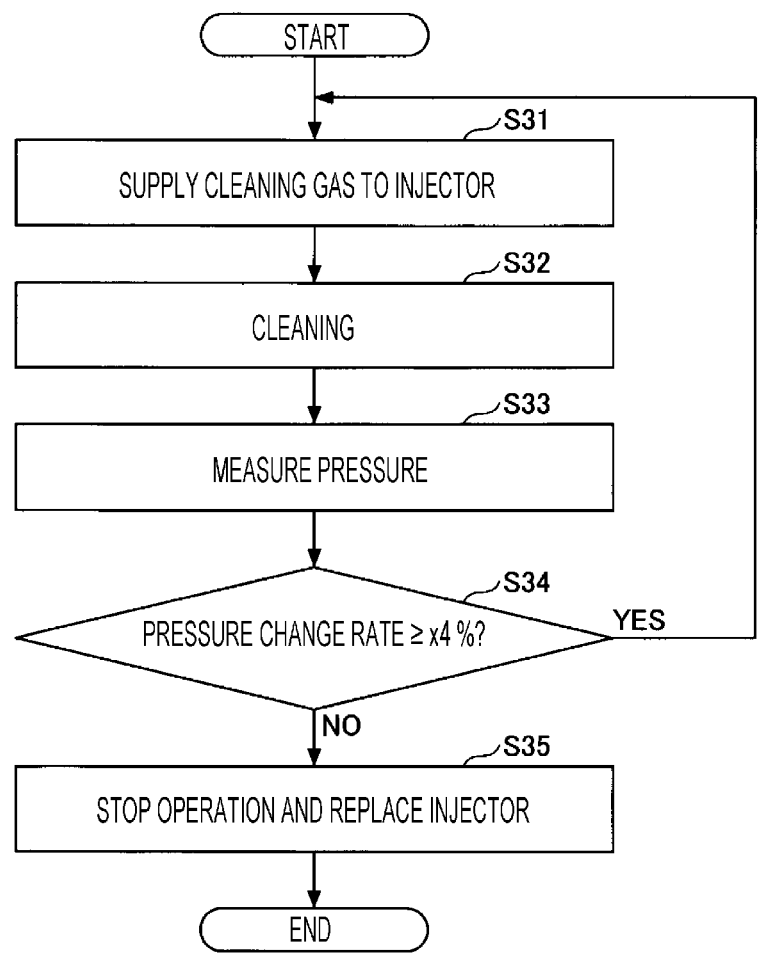
FIG. 7 is a flow chart illustrating a third modification of the abnormality detection method according to the embodiment.

Next, an abnormality detection method according to a third modification will be described with reference to a flow chart illustrating the abnormality detection method according to the third modification of FIG. 7. This process is controlled by the controller 90.

In this process, an abnormality detection method is executed during the cleaning process. That is, in step S31, the processing gas (cleaning gas) is output from the processing gas source 21, supplied to the injectors 28 and 29 via the gas pipe 20, and horizontally discharged into the inner pipe 11 from the gas holes 28*a* and 29*a* of the injectors 28 and 29. Next, in step S32, the cleaning process inside the processing container 10 is executed.

While the film forming process is being executed, the processing gas is controlled to a predetermined flow rate by the flow rate controller 25 and stably supplied. Next, in step S33, the pressure gauge 66 measures the pressure while the cleaning process is being executed. Next, in step S34, the controller 90 calculates the pressure change rate using the measured pressure. A preset threshold value x4 used for determining an abnormality during the cleaning process is stored in the storage unit. The controller 90 compares the pressure change rate with the threshold value x4, and when it is determined that the pressure change rate is less than the threshold value x4, the controller 90 returns to step S31 and continues the cleaning process.

Meanwhile, when it is determined that the pressure change rate is less than the threshold value x4, the controller 90 proceeds to step S35, stops the operation of the processing apparatus 1, replaces the injector, and ends this process.

As described above, the abnormality detection process of the present disclosure may be executed during the film forming process of any lot, or may be executed during the film forming process of each lot. The abnormality detection process may be executed after the film forming process of any lot and before the next cleaning process, or may be executed during the cleaning process. The abnormality detection process may be executed during or after a substrate process (e.g., an etching process) other than the film forming process.

In any case, in the abnormality detection process, the gas type, gas flow rate, and gas supply time are substantially the same when the pressure is measured by the pressure gauge 6 when the etching amount is 0 (i.e., when the injector is new), and it is important to measure the pressure at a state where the gas supply is stabilized.

As described above, according to the abnormality detection method of the present embodiment, the abnormality of the gas supply into the processing container 10 of the processing apparatus 1 is detected. Specifically, by monitoring the pressure change rate from the new state of the injectors 28 and 29, it is possible to detect abnormality of at least one of the injectors 28 and 29 and the gas pipe 20.

In addition, the abnormality may be specified based on the calculated pressure change rate. For example, when the pressure change rate from the new state of an injector is 60% or more and less than 80%, it is predicted that the injector is damaged or the gas hole is enlarged, and when the pressure change rate is less than 60%, it is predicted that a leak has occurred due to improper installation of the injector. In this regard, an abnormality may be specified from the magnitude of the conductance change indicated by the pressure change rate.

The processing apparatus of the present disclosure may be any device that executes a predetermined process (e.g., a film forming process, etching process, cleaning process, etc.), and is not limited to the processing apparatus 1 illustrated in FIG. 1. Further, the process executed by the processing apparatus of the present disclosure may or may not use plasma.

According to an aspect of the present disclosure, it is possible to detect an abnormality in the supply of gas into the processing container of the processing apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An abnormality detection method comprising:
   supplying a gas controlled to a selected flow rate to a gas supply pipe via the gas pipe connected to the gas supply pipe, thereby introducing the gas into a reaction region of a processing container provided in a processing apparatus from a gas hole of the gas supply pipe;
   measuring a pressure inside the gas pipe by a pressure gauge attached to the gas pipe; and
   detecting an abnormality of at least one of the gas supply pipe and the gas pipe based on a rate of change in the pressure measured by the pressure gauge for the gas supply pipe with respect to a pressure measured by the pressure gauge for a new gas supply pipe.

2. The abnormality detection method according to claim 1, wherein the detecting the abnormality stops an operation of the processing apparatus and performs a replacement of the gas supply pipe according to a detection result of the abnormality.

3. The abnormality detection method according to claim 2, wherein the introducing the gas introduces the gas controlled to a selected flow rate into the reaction region of the processing container after a substrate processing or cleaning processing is performed in the reaction region of the processing container,
the measuring the pressure measures the pressure in the gas pipe by the pressure gauge after the substrate processing or cleaning processing is performed, and
the detecting the abnormality detects the abnormality based on a rate of change in the measured pressure after the substrate processing or cleaning processing is performed.

4. The abnormality detection method according to claim 2, wherein the introducing the gas introduces a processing gas or cleaning gas controlled to a selected flow rate into the reaction region of the processing container while a substrate processing or cleaning processing is performed in the reaction region of the processing container,
the measuring the pressure measures the pressure in the gas pipe by the pressure gauge while the substrate processing or cleaning processing is performed, and
the detecting the abnormality detects the abnormality based on a rate of change in the measured pressure while the substrate processing or cleaning processing is performed.

5. The abnormality detection method according to claim 4, wherein the detecting the abnormality includes at least detecting one of a damage to the gas supply pipe, a decrease of a thickness of the gas supply pipe, an increase of the thickness of the gas supply pipe, an enlargement of the gas hole, a reduction of the gas hole, an improper installation of the gas supply pipe, a defective connection between the gas supply pipe and the gas pipe, and a change in a conductance of the gas supply pipe.

6. The abnormality detection method according to claim 1, wherein the detecting the abnormality includes detecting at least one of a damage to the gas supply pipe, a decrease of a thickness of the gas supply pipe, an increase of the thickness of the gas supply pipe, an enlargement of the gas hole, a reduction of the gas hole, an improper installation of the gas supply pipe, a defective connection between the gas supply pipe and the gas pipe, and a change in a conductance of the gas supply pipe.

7. A processing apparatus comprising:
a processing container configured to process a substrate mounted on a substrate holder provided in the processing container;
a gas supply pipe including a gas supply hole and configured to supply a gas to a reaction region of the processing container;
a gas pipe connected to the gas supply pipe provided with a pressure gauge attached thereto; and
a controller configured to control an overall process of the processing apparatus,
wherein the controller is configured to perform a process including:
controlling the gas to a selected flow rate;
supplying the gas controlled to a selected flow rate at the controlling to the gas supply pipe via the gas pipe, thereby introducing the gas into the reaction region of the processing container from the gas supply hole of the gas supply pipe;
measuring a pressure inside the gas pipe by the pressure gauge attached to the gas pipe; and
detecting an abnormality of at least one of the gas supply pipe and the gas pipe based on a rate of change in the pressure measured by the pressure gauge for the gas supply pipe with respect to a pressure measured by the pressure gauge for a new gas supply pipe.

8. The abnormality detection method according to claim 1, further comprising:
controlling a gas type and a gas flow rate under same conditions before and after the detecting the abnormality.

9. The abnormality detection method according to claim 1, further comprising:
removing a residual gas in a gas flow path connected from the gas supply pipe to a gas source through the gas pipe before the supplying the gas.

* * * * *